(12) United States Patent
Seo et al.

(10) Patent No.: US 7,700,898 B2
(45) Date of Patent: Apr. 20, 2010

(54) HEAT TREATMENT EQUIPMENT AND METHOD OF DRIVING THE SAME

(75) Inventors: Dae-Man Seo, Hwaseong-si (KR); Jang-Hyeok Lee, Suwon-si (KR); Dae-Woo Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 833 days.

(21) Appl. No.: 11/528,751

(22) Filed: Sep. 28, 2006

(65) Prior Publication Data
US 2007/0080156 A1 Apr. 12, 2007

(30) Foreign Application Priority Data
Oct. 4, 2005 (KR) .................. 10-2005-0093072

(51) Int. Cl.
F27B 5/00 (2006.01)
F27B 5/10 (2006.01)
F27B 5/18 (2006.01)
F27D 1/18 (2006.01)

(52) U.S. Cl. .............. 219/390; 118/733; 110/185; 110/173 R; 110/176; 373/110

(58) Field of Classification Search .................. None
See application file for complete search history.

(56) References Cited

U.S. PATENT DOCUMENTS

| | | | |
|---|---|---|---|
| 6,776,874 B2 * | 8/2004 | Kobayashi et al. ..... | 156/345.51 |
| 6,988,886 B2 * | 1/2006 | Takata et al. ................ | 432/242 |
| 7,398,692 B2 * | 7/2008 | Hiroki et al. ................. | 73/706 |
| 2007/0012117 A1 * | 1/2007 | Hiroki et al. ................. | 73/768 |

FOREIGN PATENT DOCUMENTS

| | | | |
|---|---|---|---|
| JP | 2004-228359 | | 8/2004 |
| KR | 10-1999-0084569 | | 12/1999 |
| KR | 20020084455 A | * | 9/2002 |
| KR | 10-2005-0050788 | | 6/2005 |

* cited by examiner

*Primary Examiner*—Joseph M Pelham
(74) *Attorney, Agent, or Firm*—Mills & Onello, LLP (57) ABSTRACT

Heat treatment equipment and a method of driving the same are provided. The heat treatment equipment includes: a process tube having an aperture at one side thereof; a sealing unit for opening or closing the aperture; and a pressure sensor for measuring sealing pressure between the sealing unit and the one side of the process tube. In the heat treatment equipment, the aperture of the process tube can be sealed according to the sealing pressure of the sealing unit so that the process tube can be precisely sealed.

16 Claims, 5 Drawing Sheets

HEAT TREATMENT EQUIPMENT AND METHOD OF DRIVING THE SAME

This U.S. nonprovisional patent application claims priority under 35 U.S.C. §119 of Korean Patent Application 2005-93072 filed on Oct. 4, 2005, the entire contents of which are hereby incorporated by reference.

BACKGROUND OF THE INVENTION

1. Field of the Invention

The present invention relates to equipment and a method for manufacturing a semiconductor device, and more particularly, to heat treatment equipment for processing a wafer through a heat treatment process and a method of driving the same.

2. Description of Related Art

Generally, semiconductor devices are manufactured by repeatedly performing various processes such as photolithography, diffusion, deposition, etching, metallization, etc. on a semiconductor substrate made of pure silicon.

Of these manufacturing processes, diffusion and deposition processes are performed by a heat treatment process at a high temperature. Heat treatment equipment for performing the heat treatment process can be horizontal heat treatment equipment and/or vertical heat treatment equipment, i.e., vertical furnace equipment. Typically, the veridical heat treatment equipment is mainly used in the semiconductor manufacturing process to meet high productivity and reliability requirements.

The conventional vertical heat treatment equipment includes a process tube which is heated to a high temperature and has an aperture at its bottom surface such that a wafer is transferred into the interior of the vertical heat treatment equipment, a tube cap for sealing the bottom surface having the aperture of the process tube, a motor rotating at a predetermined speed to lift the tube cap by a predetermined distance such that the tube cap seals the bottom surface of the process tube, a gear assembly engaged with the motor, a lifting unit containing a ball screw coupled to the gear assembly, and an encoder controlling a rotation value of the motor such that the lifting unit allows the tube cap to move up to a position suitable for sealing the process tube.

The conventional vertical heat treatment equipment seals the aperture of the process tube.

An operator inputs a value corresponding to a rotation value of the motor to the encoder to rotate the motor.

The motor rotates in response to the input value, and the tube cap is lifted by a predetermined distance by the motor, the gear assembly engaged with the motor, and the ball screw coupled to the gear assembly, thereby sealing the aperture of the process tube.

However, the conventional vertical heat treatment equipment may cause several problems because the operation for sealing the aperture of the process tube is performed by an encoder value input by the operator.

When the aperture of the process tube is sealed by the encoder value input by the operator, an encoder value smaller than a predetermined encoder value which should be input may be input. In this case, the tube cap does not reach a position suitable for sealing the aperture of the process tube, so that a leak may occur. That is, the aperture of the process tube may not be sealed. As a result, internal temperature and pressure of the process tube in which the diffusion or deposition process is being performed may not be appropriate, leading to many processing problems. In order to solve the above described problems, a predetermined encoder value is obtained through many repetitions of testing, and then the process is performed using the obtained encoder value. However, this method may have a problem in that the tube cap may not move to a position suitable for sealing the aperture of the process tube due to, for example, degradation of the gear assembly or the ball screw.

When the aperture of the process tube is sealed by the encoder value input by the operator, an encoder value larger than a predetermined encoder value which should be input may be input. In this case, the motor rotates more than an allowed rotation value due to the larger encoder value. This not only causes excessive impact on the gear assembly engaged with the motor and the ball screw but also may destroy the tube cap which is moved by the gear assembly and the ball screw.

SUMMARY OF THE INVENTION

A feature of the present invention is to provide heat treatment equipment and a method of driving the same capable of precisely sealing a process tube.

Another feature of the present invention is to provide heat treatment equipment and a method of driving the same in which a tube cap and parts for moving the tube cap are protected from any excessive impact.

According to a first aspect, the present invention is directed to heat treatment equipment comprising: a process tube having an aperture at one side thereof; a sealing unit for opening or closing the aperture; and a pressure sensor for measuring sealing pressure between the sealing unit and the one side of the process tube.

In some embodiments of the present invention, the sealing unit may include a tube cap contacting the one side of the process tube and a cap base for elastically supporting the tube cap. At least one pressure sensor may be installed in the cap base. A plurality of pressure sensors may be installed in the outside of the cap base and contact the one side of the process tube when the sealing unit seals the aperture.

In other embodiments, the heat treatment equipment may further include a moving unit coupled to the sealing unit to move the sealing unit and a controller for controlling driving of the moving unit according to the pressure measured by the pressure sensor. The moving unit may include a motor, and the controller may control driving of the motor. The moving unit may further include an encoder for detecting a rotation value of the motor.

In still other embodiments, the heat treatment equipment may further include a display unit coupled to the encoder to display the rotation value of the motor detected by the encoder.

According to another aspect, the present invention is directed to vertical furnace equipment comprising: a vertical process tube having an aperture formed in a bottom surface thereof; a sealing unit for opening or closing the aperture; a moving unit coupled to the sealing unit to move the sealing unit so that the sealing unit can open or close the aperture; a pressure sensor for measuring sealing pressure between the sealing unit and the bottom surface of the process tube; and a controller for controlling driving of the moving unit according to the sealing pressure measured by the pressure sensor.

In some embodiments of the present invention, the sealing unit may include a tube cap contacting the bottom surface of the process tube and a cap base for elastically supporting the tube cap.

In one embodiment, at least one pressure sensor is installed in the cap base. A plurality of pressure sensors may be installed at the outside of the cap base and contact the bottom surface of the process tube when the sealing unit seals the aperture. The moving unit may include a motor, and the controller may control driving of the motor. The moving unit may further include an encoder for detecting a rotation value of the motor. The equipment may further comprise a display unit coupled to the encoder to display the rotation value of the motor detected by the encoder.

According to another aspect, the present invention is directed to a method of driving heat treatment equipment comprising a process tube having an aperture formed at one side thereof, a sealing unit for opening or closing the aperture, and a moving unit for moving the sealing unit so that the sealing unit can open or close the aperture, the method comprising: measuring sealing pressure between the sealing unit and the one side of the process tube using a pressure sensor; and, using a controller, controlling driving of the moving unit according to the sealing pressure measured by the pressure sensor.

In some embodiments of the present invention, the moving unit may drive a motor to move the sealing unit. The controller may control driving of the motor.

In other embodiments, the method may further include generating an alarm when the sealing pressure measured by the pressure sensor exceeds a threshold pressure.

In still other embodiments, the method may further include stopping the driving of the moving unit when the sealing pressure measured by the pressure sensor exceeds a threshold pressure.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
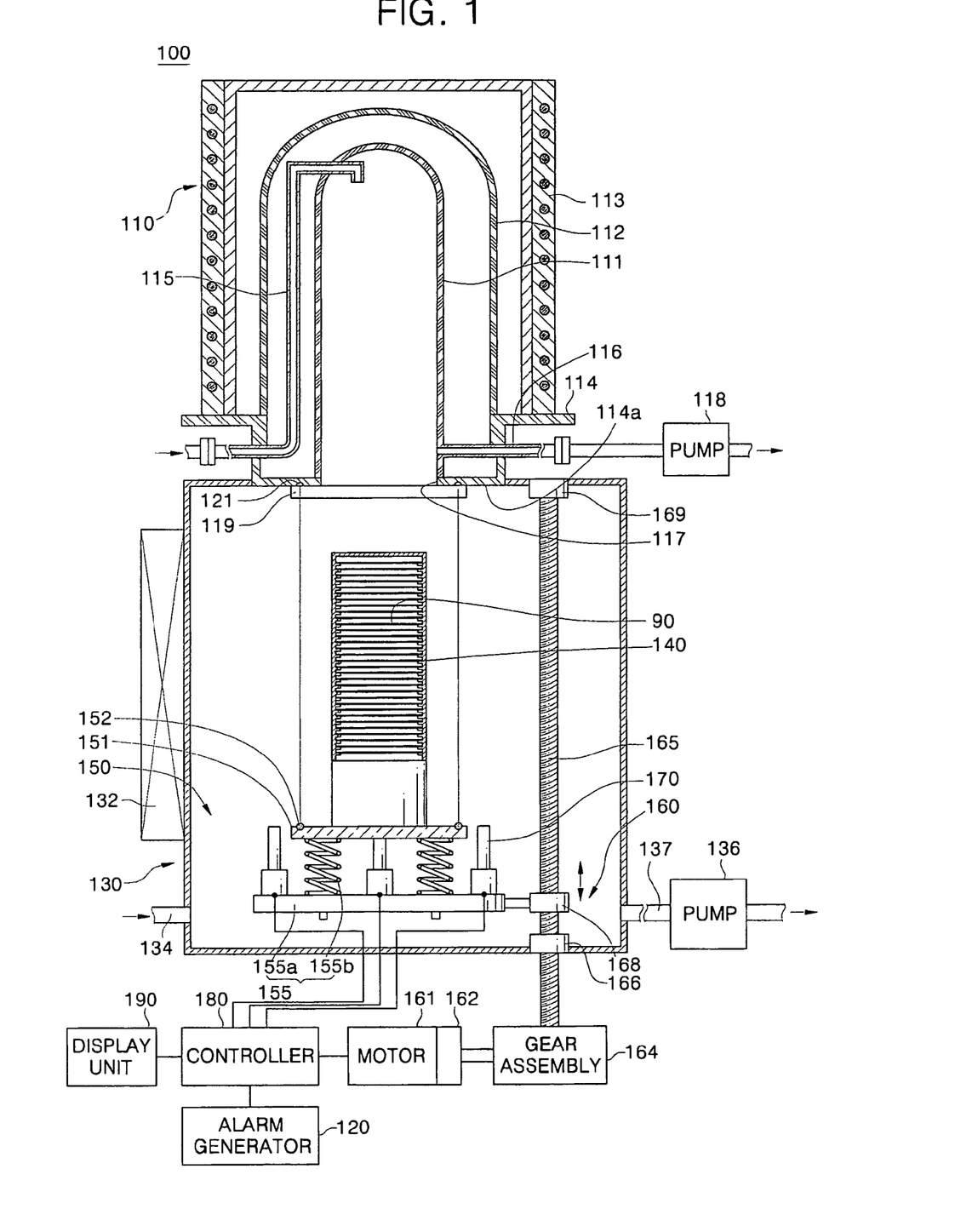
FIG. 1 is a cross-sectional view of heat treatment equipment according to an exemplary embodiment of the present invention.
Figure 2:
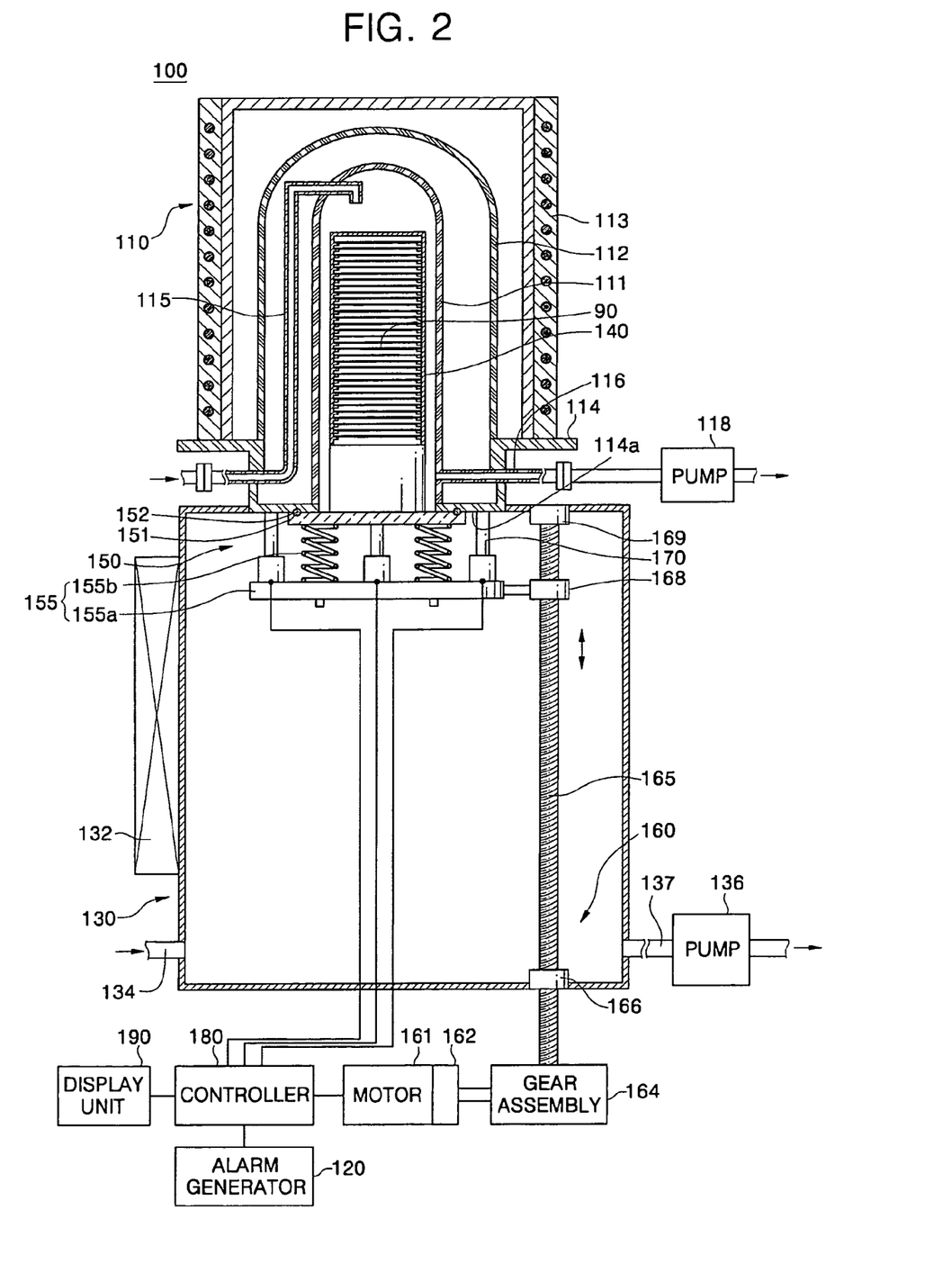
FIG. 2 is a cross-sectional view illustrating a state in which a process tube of the heat treatment equipment of FIG. 1 is normally sealed.
Figure 3:
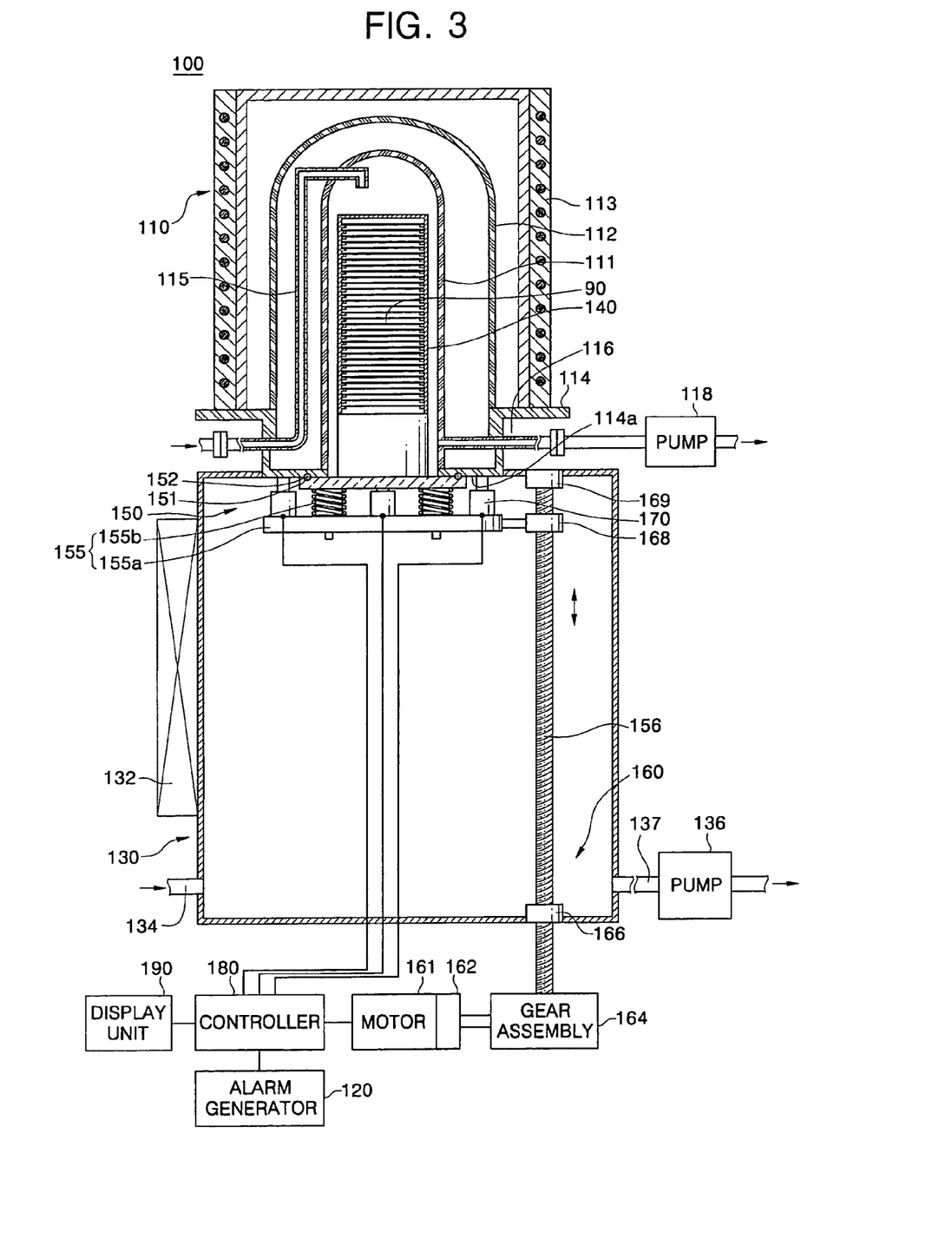
FIG. 3 is a cross-sectional view illustrating a state in which the process tube of the heat treatment equipment of FIG. 1 is overly sealed.
Figure 4:
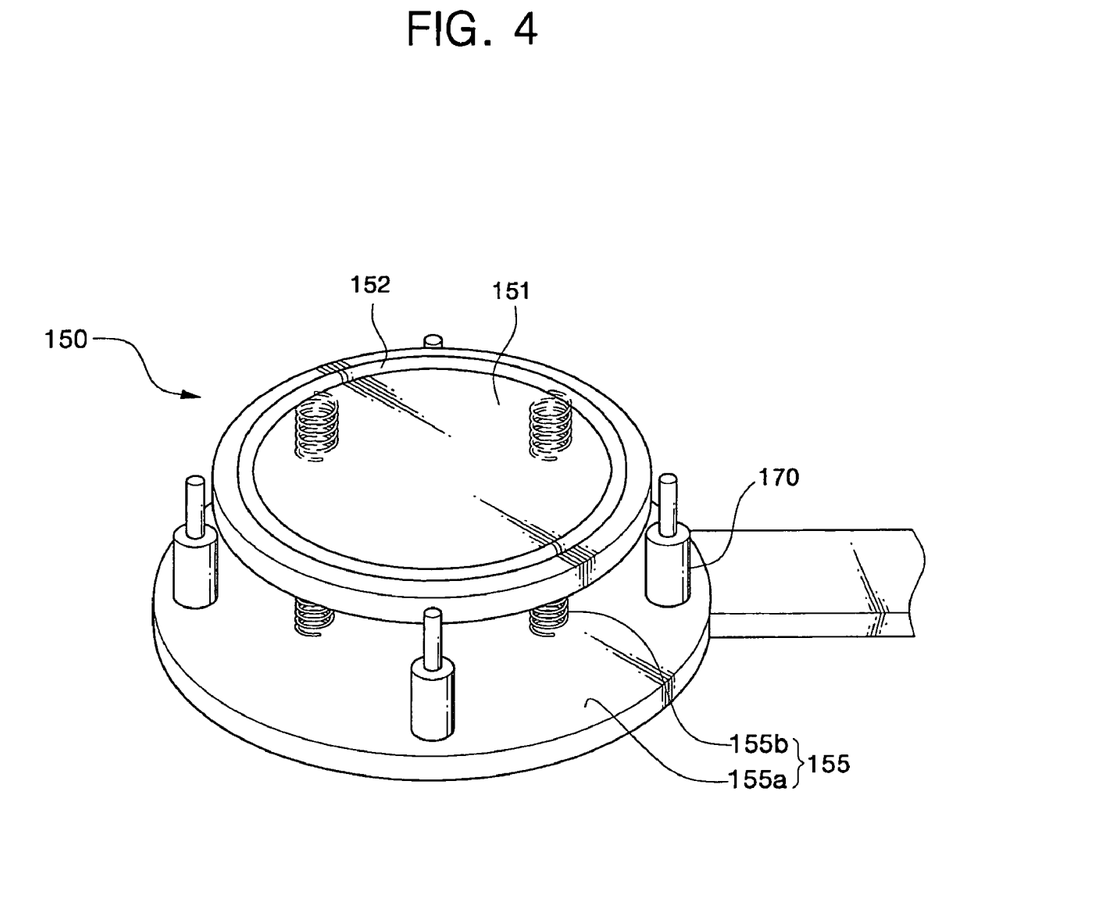
FIG. 4 is a perspective view of a sealing unit of the heat treatment equipment of FIG. 1.
Figure 5:
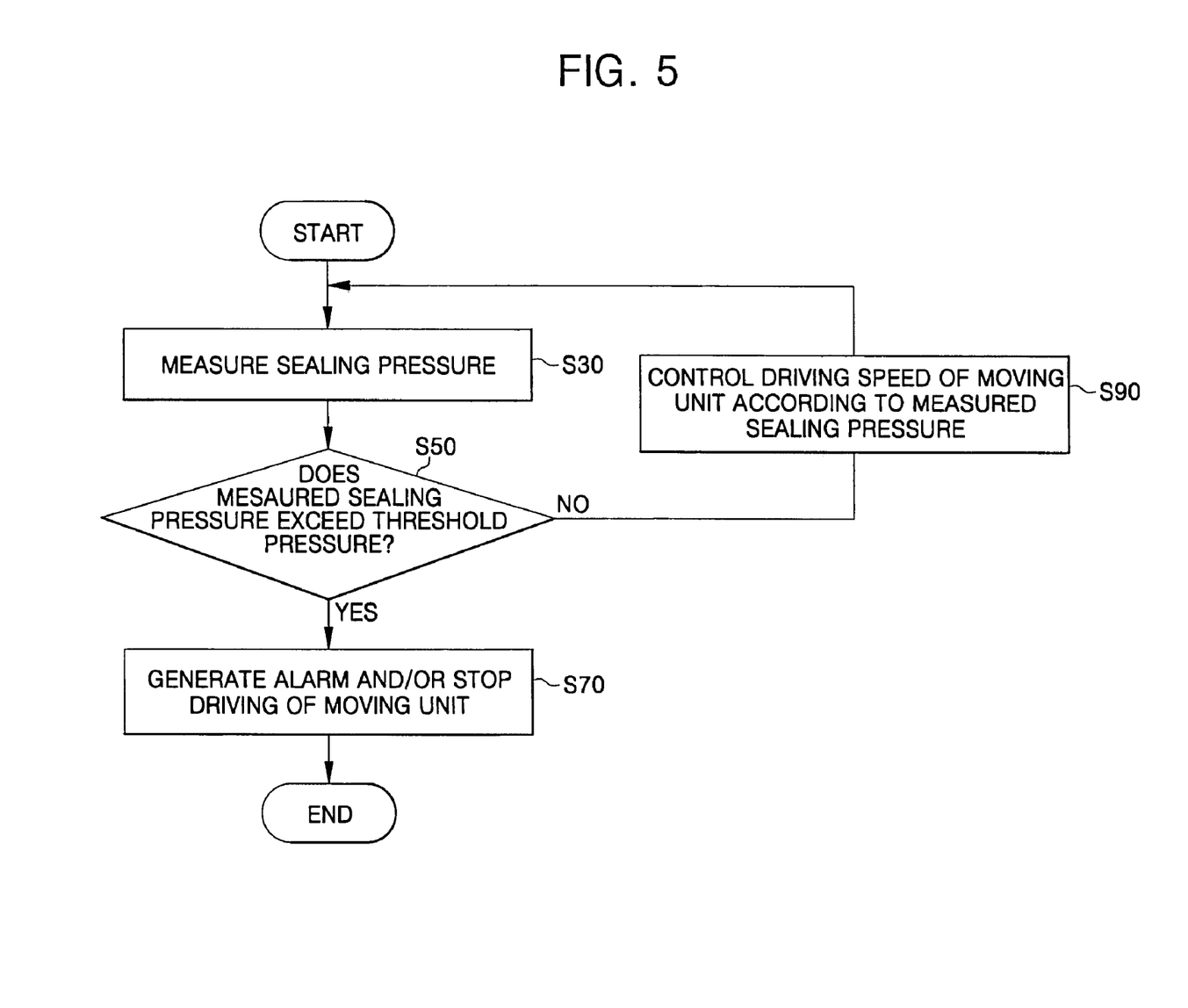
FIG. 5 is a flowchart illustrating a method of driving the heat treatment equipment according to an exemplary embodiment of the present invention.

FIG. 1 is a cross-sectional view of heat treatment equipment according to an exemplary embodiment of the present invention, FIG. 2 is a cross-sectional view illustrating the state in which a process tube of the heat treatment equipment of FIG. 1 is normally sealed, FIG. 3 is a cross-sectional view illustrating the state in which the process tube of the heat treatment equipment of FIG. 1 is overly sealed, FIG. 4 is a perspective view of a sealing unit of the heat treatment equipment of FIG. 1, and FIG. 5 is a flowchart illustrating a method of driving the heat treatment equipment according to an exemplary embodiment of the present invention.

Referring to FIGS. 1 to 4, the heat treatment equipment 100 of the present invention includes a process tube 110 for providing a space for a heat treatment process, a load lock chamber 130 connected to the process tube 110 to provide a space for a boat 140 on which a wafer 90 is loaded, and a shutter 119 arranged between the process tube 110 and the load lock chamber 130 to selectively shut between the process tube 110 and the load lock chamber 130. The heat treatment equipment 100 of the present invention is vertical furnace equipment.

Specifically, the process tube 110 is made of quartz and includes an inner process tube 111 and an outer process tube 112 which are vertically arranged with a predetermined gap therebetween and a flange 114 disposed below the inner and outer process tubes 111 and 112 to support the inner and outer process tubes 111 and 112.

The inner process tube 111 has a hollow cylindrical shape having a predetermined diameter, and has an aperture in its lower portion. The boat 140 having the wafer 9 loaded thereon is transferred to the interior of the inner process tube 111 through the aperture.

The outer process tube 112 has a hollow cylindrical shape having a larger diameter than that of the inner process tube 111 and has an aperture in its lower portion like the inner process tube 111. The outer process tube 112 is arranged to surround the inner process tube 111 through the aperture. That is, the inner process tube 111 is inserted into the interior of the outer process tube 112 through the aperture of the outer process tube 112. A heater 113 for heating the inner and outer process tubes 111 and 112 is arranged outside the outer process tube 112. The heater 113 can heat the inner and outer process tubes 111 and 112 at different temperatures from each other according to each process performed in the interior of the inner and outer process tubes 111 and 112. For example, in order to perform a diffusion process, the heater 113 can heat the inner and outer process tubes 111 and 112 so that the internal temperature of the inner and outer process tubes 111 and 112 can become about 800 degrees C. to 1200 degrees C., and in order to perform a deposition process, it can heat the inner and outer process tubes 111 and 112 so that the internal temperature of the inner and outer process tubes 111 and 112 can become about 500 degrees C. to 1000 degrees C.

The flange 114 functions to support the inner and outer process tubes 111 and 112 and the heater 113. A bottom surface 114a of the flange 114, i.e., a bottom surface of the process tube 110, has an aperture 117 which communicates with the aperture of the inner process tube 111. Thus, the wafer 90 loaded on the boat 140 is transferred into the interior of the inner process tube 111 through the aperture 117. A gas supplying line 115 for supplying a predetermined reaction gas to the inner process tube 111 is installed at one lower side of the process tube 110, i.e., one side of the flange 114. A gas exhaust line 116 for exhausting the internal gas of the inner process tube 111 or adjusting the internal pressure of the inner process tube 111 is installed at the other lower side of the process tube 110, i.e., the other side of the flange 114. A pump 118 and a valve (not shown) for smoothly exhausting the internal gas or smoothly adjusting the internal pressure can be further installed on the gas exhaust line 116. Reference numeral 121 indicates a sealing groove arranged on the bottom surface 114a of the flange 114, i.e., the outer side of the aperture 117 of the flange 114.

The load lock chamber 130 is sealed to prevent the wafer 90 loaded therein from contacting oxygen. That is, oxygen exists in the air when the wafer 90 is loaded into the interior of the load lock chamber 130, and the load lock chamber 130 removes the oxygen to thereby prevent a natural oxide layer from being formed on the wafer 90. A gas supplying line 134 for supplying a purge gas to the interior of the load lock chamber 130 is installed at one side of a lower or upper portion of the load lock chamber 130, and a gas exhaust line 137 for exhausting the internal gas of the load lock chamber 130 is installed at the other side of the lower or upper portion of the load lock chamber 130. The purge gas is used to prevent a natural oxide layer which occurs when the wafer 90 contacts oxygen and may be nitrogen gas ($N_2$). Reference numeral 136 indicates a pump installed on the gas exhaust line 137.

A door 132 for loading the wafer 90 into the interior of the load lock chamber 130 or unloading the wafer 90 from the interior of the load lock chamber 130 is installed at one side of the load lock chamber 130. The door 132 is always kept closed to prevent the wafer 90 from contacting oxygen except when loading or unloading the wafer 90.

The boat 140 made of quartz is installed in the load lock chamber 130 to load and support a plurality of wafers 90 (about 150 pieces).

A sealing unit 150 is arranged in a lower portion of the boat 140. The sealing unit 150 supports the boat 140, transfers the boat 140 into the interior of the inner process tube 111, and contacts the bottom surface 114a of the flange 114 to thereby seal the aperture 117 of the flange 114.

The sealing unit 150 includes a tube cap 151 contacting the bottom surface 114a of the flange 114 and a cap base 155 for elastically supporting a bottom portion, i.e., a lower portion of the tube cap 151 so that the tube cap 151 can tightly contact the bottom surface 114a of the flange 114. The tube cap 151 has a disc shape having a predetermined diameter, and a sealing ring 152 such as an O-ring is installed on the tube cap 151 to be fitted into the sealing groove 121. The cap base 155 includes a disc-shaped plate 155a having a larger diameter than that of the tube cap 151 and a plurality of elastic members 155b interposed between the tube cap 151 and the plate 155a. The elastic member 155b may be a plurality of coil springs interposed between the tube cap 151 and the plate 155a to elastically support the tube cap 151. In this case, the coil springs are installed such that lower and upper ends of the coil springs are respectively attached to the plate 155a and the tube cap 151.

The sealing unit 150 is moved by a moving unit 160 to tightly close or open the aperture 117 of the flange 114. The moving unit 160 may employ a ball screw type, a cylinder type, or a linear motor type.

In more detail, the moving unit 160 vertically installed at one side of the load lock chamber 130 includes: a driving shaft 165 which has a male screw formed on the outside thereof and is rotatably installed; a plate coupler 168 which has a female screw formed on the inside thereof to be engaged with the driving shaft 165, moves vertically according to a rotation direction of the driving shaft 165, and has one side coupled to the plate 155a; a motor 161 which rotates at a predetermined speed to vertically move the plate coupler 168; a gear assembly 164 which transfers the rotary power of the motor 161 to the driving shaft 165 to thereby rotate the driving shaft 165; and an encoder 162 which detects a rotation value of the motor 161 to detect the number of times the motor 161 rotates. Reference numerals 166 and 169 indicate lower and upper bearings 166 and 169 which are respectively installed at lower and upper portions of the load lock chamber 130 to allow the driving shaft 165 to smoothly rotate.

The heat treatment equipment 100 further includes a pressure sensor 170 for measuring sealing pressure between the sealing unit 150 and the lower portion of the process tube 110 when the sealing unit 150 is sealed to the lower portion of the process tube 110 and a controller 180 coupled to the pressure sensor 170.

In more detail, the pressure sensor 170 measures the sealing pressure of the sealing unit 150 when the sealing unit 150 is sealed to the lower portion of the process tube 110, i.e., the bottom surface 114a of the flange 114 by the moving unit 160, and transmits the measured sealing pressure to the controller 180. The pressure sensor 170 is installed at a location where the pressure of the sealing unit 150 can be measured. For example, the pressure sensor 170 can be installed on the outside of the cap base 155. Alternatively, at least one pressure sensor 170 can be installed in four directions of the cap base 155, respectively. In this case, the pressure sensor 170 can measure not only the average sealing pressure of the sealing unit 150 when the sealing unit 150 seals the bottom surface 114a of the flange 114 but also the sealing pressure of each direction of the sealing unit 150 when the sealing unit 150 seals each direction of the bottom surface 114a of the flange 114. The controller 180 controls the driving of the moving unit 160 using the average of the sealing pressures measured by the pressure sensors 170.

The controller 180 is coupled to the pressure sensor 170 to receive the sealing pressure measured by the pressure sensor 170, and controls the driving of the moving unit 160 according to the sealing pressure or the average of the sealing pressures measured by the pressure sensor 170. That is, since the moving unit 160 drives the motor 161 which rotates at a predetermined speed to move the sealing unit 150, the controller 180 controls movement of the moving unit 160 by controlling the driving of the motor 161 according to the measured sealing pressure of the pressure sensor 170.

For example, assuming that the sealing pressure is "100 $kgf/cm^2$" when the sealing unit 150 seals the aperture 117 of the flange 114, the controller 180 controls moving of the moving unit 160 and sealing of the sealing unit 150 such that it lifts the sealing unit 150 by setting the speed of the motor 161 to "20 RPM" when the sealing pressure measured by the pressure sensor 170 is "0 $kgf/cm^2$", lifts the sealing unit 150 by setting the speed of the motor 161 to "10 RPM" when the sealing pressure measured by the pressure sensor 170 is "50 $kgf/cm^2$", and stops lifting the sealing unit 150 by setting the speed of the motor 161 to "0 RPM" when the sealing pressure measured by the pressure sensor 170 is "100 $kgf/cm^2$".

The heat treatment equipment 100 further includes a display unit 190 which is coupled to the pressure sensor 170 and the encoder 162 to display the sealing pressure measured by the pressure sensor 170 and the rotation value of the motor 161 sensed by the encoder 162. In this case, the operator can be aware of the sealing state of the flange 114, the front/rear and left/right balance of the sealing unit 150, and the degradation of the gear assembly 164 or the driving shaft 165 through the display unit 190. Thus, the operator can check the balance of the sealing unit 150 or the degradation of the gear assembly 164 by observing the state of the heat treatment equipment 100.

The heat treatment equipment 100 further includes an alarm generator 120 and an interlock device (not shown) which are coupled to the pressure sensor 170. The alarm generator 120 generates an alarm signal to let the operator know the state of the heat treatment equipment 100 when the sealing pressure measured by the pressure sensor 170 exceeds a previously set reference pressure, i.e., a threshold pressure. The interlock device stops the moving of the moving unit 160 such that the tube cap 151 and the moving unit 160 are not damaged when the sealing pressure measured by the pressure sensor 170 exceeds the threshold pressure.

The operation of the heat treatment equipment of the present invention will now be described with reference to FIGS. 1 to 5.

First, when the door 132 formed at one side of the load lock chamber 130 is opened, a wafer transfer robot (not shown) loads the wafer 90 to the boat 140 arranged in the load lock chamber 130 through the door 132 from the exterior.

Then, when the loading of the wafer 90 is completed, the door 132 is closed, and the pump 136 coupled to the load lock chamber 130 pumps the gas in the load lock chamber 130 through the gas exhaust line 137 to make the pressure of the load lock chamber 130 equal to the pressure of the process tube 110.

Thereafter, when the pressure of the load lock chamber 130 becomes the same as the pressure of the process tube 110, the shutter 119 is opened.

When the shutter 119 is opened, the pressure sensor 170 measures the sealing pressure of the sealing unit 150 (step S30), and the controller 180 determines whether the sealing pressure measured by the pressure sensor 170 exceeds predetermined threshold pressure (step S50). When the sealing pressure measured by the pressure sensor 170 does not exceed the predetermined threshold pressure, the controller 180 adjusts a moving speed of the moving unit 160 according to the sealing pressure measured by the pressure sensor 170 (step S90) to thereby seal the flange 114 of the process tube 110.

That is, if it is assumed that the sealing pressure is "100 kgf/cm$^2$" when the sealing unit 150 precisely seals the aperture 117 of the flange 114, the controller 180 controls the motor 161 to lift the sealing unit 160 at a high speed when the sealing pressure measured by the pressure sensor is "0 kgf/cm$^2$". Then, when the sealing pressure measured by the pressure sensor is "50 kgf/cm$^2$", the controller 180 controls the motor 161 to lift the sealing unit 160 at a low speed, and the sealing pressure measured by the pressure sensor is "90 kgf/cm$^2$", the controller 180 controls the motor 161 to reduce the speed of the sealing unit 160 lifting at a low speed and seal the aperture 117 of the flange 114 using the sealing unit 150.

However, when the sealing pressure measured by the pressure sensor 170 exceeds the predetermined threshold pressure (step S50), the alarm generator 120 generates an alarm to let the operator know the state of the heat treatment equipment, and the interlock device stops the moving of the moving unit 160 to prevent the tube cap 151 and the moving unit 160 from being damaged (step S70).

When the wafer 90 in the load lock chamber 130 is transferred into the process tube 110, the shutter 119 is closed again, and the process tube 110 is heated, thereby performing the diffusion or deposition process.

As described above, according to the heat treatment equipment and the method of driving the same of the present invention, the speed of the motor is controlled to seal the aperture of the flange according to the sealing pressure of the sealing unit, so that the process tube can be precisely sealed without any leak.

Further, since the moving of the moving unit for moving the sealing unit is stopped when the excessive sealing pressure is measured, any possible damage of the components resulting from an erroneous encoder value can be prevented.

Furthermore, since the sealing pressure measured by the pressure sensor and the rotation value of the motor sensed by the encoder are displayed through the display unit, the operator can be aware of the sealing state of the flange, the front-rear and left-right balance of the sealing unit, and the degradation of the gear assembly or the driving shaft through the display unit.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. Heat treatment equipment, comprising:
   a process tube having an aperture at one side thereof;
   a sealing unit for opening or closing the aperture; and
   a pressure sensor for measuring sealing pressure between the sealing unit and the one side of the process tube,
   wherein the sealing unit comprises a tube cap contacting the one side of the process tube and a cap base for elastically supporting the tube cap, and
   wherein a plurality of pressure sensors are installed at the outside of the cap base and contact the one side of the process tube when the sealing unit seals the aperture.

2. The heat treatment equipment of claim 1, wherein at least one pressure sensor is installed in the cap base.

3. The heat treatment equipment of claim 1, further comprising a moving unit coupled to the sealing unit to move the sealing unit and a controller for controlling driving of the moving unit according to the pressure measured by the pressure sensor.

4. The heat treatment equipment of claim 3, wherein the moving unit comprises a motor, and the controller controls driving of the motor.

5. The heat treatment equipment of claim 4, wherein the moving unit further comprises an encoder for detecting a rotation value of the motor.

6. The heat treatment equipment of claim 5, further comprising a display unit coupled to the encoder to display the rotation value of the motor detected by the encoder.

7. Vertical furnace equipment, comprising:
   a vertical process tube having an aperture formed in a bottom surface thereof;
   a sealing unit for opening or closing the aperture;
   a moving unit coupled to the sealing unit to move the sealing unit so that the sealing unit can open or close the aperture;
   a pressure sensor for measuring sealing pressure between the sealing unit and the bottom surface of the process tube; and
   a controller for controlling driving of the moving unit according to the sealing pressure measured by the pressure sensor,
   wherein the sealing unit comprises a tube cap contacting the bottom surface of the process tube and a cap base for elastically supporting the tube cap, and
   wherein a plurality of pressure sensors are installed at the outside of the cap base and contact the bottom surface of the process tube when the sealing unit seals the aperture.

8. The vertical furnace equipment of claim 7, wherein at least one pressure sensor is installed in the cap base.

9. The vertical furnace equipment of claim 7, wherein the moving unit comprises a motor, and the controller controls driving of the motor.

10. The vertical furnace equipment of claim 9, wherein the moving unit further comprises an encoder for detecting a rotation value of the motor.

11. The vertical furnace equipment of claim 10, further comprising a display unit coupled to the encoder to display the rotation value of the motor detected by the encoder.

12. A method of driving heat treatment equipment comprising a process tube having an aperture formed at one side thereof, a sealing unit for opening or closing the aperture comprising a tube cap contacting the one side of the process tube and a cap base for elastically supporting the tube cap, and a moving unit for moving the sealing unit so that the sealing unit can open or close the aperture, the method comprising:

measuring sealing pressure between the sealing unit and the one side of the process tube using a plurality of pressure sensors installed at the outside of the cap base, the plurality of pressure sensors contacting the one side of the process tube when the sealing unit seals the aperture; and     using a controller, controlling driving of the moving unit according to the sealing pressure measured by the pressure sensor.

13. The method of claim 12, wherein the moving unit drives a motor to move the sealing unit.

14. The method of claim 13, wherein the controller controls driving of the motor.

15. The method of claim 12, further comprising generating an alarm when the sealing pressure measured by the pressure sensor exceeds a threshold pressure.

16. The method of claim 12, further comprising stopping the driving of the moving unit when the sealing pressure measured by the pressure sensor exceeds a threshold pressure.

\* \* \* \* \*